(12) United States Patent
Ohashi (10) Patent No.: US 9,022,530 B2
(45) Date of Patent: May 5, 2015

(54) PIEZOELECTRIC ELEMENT, LIQUID EJECTING HEAD, AND LIQUID EJECTING APPARATUS

(75) Inventor: Koji Ohashi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 546 days.

(21) Appl. No.: 13/481,355

(22) Filed: May 25, 2012

(65) Prior Publication Data

US 2012/0305665 A1    Dec. 6, 2012

(30) Foreign Application Priority Data

Jun. 1, 2011    (JP) .................................. 2011-123837

(51) Int. Cl.
| | |
|---|---|
| *B41J 2/045* | (2006.01) |
| *B41J 2/14* | (2006.01) |
| *B41J 2/055* | (2006.01) |
| *H01L 41/08* | (2006.01) |
| *H01L 41/09* | (2006.01) |
| *H01L 41/187* | (2006.01) |
| *H01L 41/29* | (2013.01) |
| *H01L 41/318* | (2013.01) |

(52) U.S. Cl.
CPC .............. *B41J 2/14233* (2013.01); *B41J 2/055* (2013.01); *B41J 2002/14241* (2013.01); *B41J 2202/03* (2013.01); *H01L 41/0805* (2013.01); *H01L 41/0973* (2013.01); *H01L 41/1876* (2013.01); *H01L 41/29* (2013.01); *H01L 41/318* (2013.01)

(58) Field of Classification Search
USPC .............. 347/68–72; 310/311, 324, 327, 358, 310/365
See application file for complete search history.

(56) References Cited

U.S. PATENT DOCUMENTS

| | | | |
|---|---|---|---|
| 7,562,968 B2* | 7/2009 | Sumi et al. ...................... | 347/68 |
| 7,568,792 B2 | 8/2009 | Takabe et al. | |
| 7,896,480 B2* | 3/2011 | Kazama et al. ................. | 347/68 |
| 2006/0232639 A1 | 10/2006 | Sumi et al. | |
| 2007/0007860 A1* | 1/2007 | Takabe et al. ................. | 310/324 |

FOREIGN PATENT DOCUMENTS

| | | |
|---|---|---|
| CN | 1841802 | 10/2006 |
| CN | 10045651 | 1/2009 |
| JP | 11-233844 | 8/1999 |
| JP | 2006-278835 | 10/2006 |
| JP | 2010-214800 | 9/2010 |

OTHER PUBLICATIONS

J.W. Hong et al.; "Nanoscale Investigation of Domain Retention in Preferentially Oriented PbZr0.53Ti047O3 Thin Films on Pt and on LaNiO3" Applied Physics Letters; vol. 75, No. 20, 3182-3185.

Khorsand Zak et al.; "Synthesis and Characterization of sol-gel derived single phase PZT Nanoparticles in Aqueous Polyol Solution" Journal of Optoelectronics and Advanced Materials vol. 12, No. 8, Aug. 2010, p. 1714-1719.

* cited by examiner

*Primary Examiner* — Kristal Feggins (74) *Attorney, Agent, or Firm* — Workman Nydegger (57) ABSTRACT

A piezoelectric element comprises a piezoelectric film which comprises perovskite type crystals at least including Pb, Ti, and Zr, and an electrode which is provided to the piezoelectric film. A diffraction peak position (2θ) of X-rays derived from a (100) plane of the piezoelectric film is from 21.89 to 21.97, and a half-peak width (2θ) of a (200) plane is from 0.30 to 0.50.

3 Claims, 10 Drawing Sheets

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-123837, filed Jun. 1, 2011 is expressly incorporated by reference.

BACKGROUND

1. Technical Field

The present invention relates to a piezoelectric element, a liquid ejecting head, and a liquid ejecting apparatus.

2. Related Art

A piezoelectric element used for a liquid ejecting head or the like is an element in which a piezoelectric film made of piezoelectric materials having an electromechanical transduction function is interposed between two electrodes. The piezoelectric film is made of crystallized piezoelectric ceramics, for example.

An example of a liquid ejecting head using such a piezoelectric element is, for example, an ink jet recording head in which a part of a pressure chamber which communicates with a nozzle opening discharging ink droplets is configured by a vibrating plate, the vibrating plate is deformed by the piezoelectric element to apply pressure to ink of the pressure chamber, and the ink droplets are discharged through the nozzle opening. Two types of ink jet recording head are in practice: One using a piezoelectric actuator in a longitudinal vibration mode which expands and contracts in the axial direction of the piezoelectric element, and one using a piezoelectric actuator in a flexural vibration mode. For such actuators, a piezoelectric element capable of obtaining a large strain with a low drive voltage, that is, a piezoelectric element with a large displacement is in demand for high density arrangement.

Here, in order to increase piezoelectric constant and remove variation, a piezoelectric element which includes a PZT and an electrode is known: in the PZT, Zr and Ti has a composition ratio so as to form a perovskite structure with rhombohedral crystals at room temperature and the crystals are oriented in a (100) direction (JP-A-11-233844).

However, such a piezoelectric element cannot have a sufficient displacement. In addition, such a problem is not limited to a liquid ejecting head represented by an ink jet recording head, and also arises in other piezoelectric elements.

SUMMARY

An advantage of some aspects of the invention is to provide a piezoelectric element capable of obtaining a large strain with a low drive voltage, a liquid ejecting head, and a liquid ejecting apparatus.

According to an aspect of the invention, there is provided a piezoelectric element including: a piezoelectric film that is formed of perovskite type crystals at least including Pb, Ti, and Zr; and an electrode that is provided in the piezoelectric film, in which a diffraction peak position (2θ) of X-rays derived from a (100) plane of the piezoelectric film is from 21.89 to 21.97, and a half-peak width (2θ) of a (200) plane is from 0.30 to 0.50. The diffraction peak position 2θ of the X-rays derived from the (100) plane of the piezoelectric layer is in the range from 21.89° to 21.97°, and the half-peak width of the (200) plane is from 0.30 to 0.50. As a result, a desired high displacement property capable of obtaining a large strain with a low drive voltage can be obtained.

According to another aspect of the invention, there is provided a liquid ejecting head having the above-described piezoelectric element. Liquid ejecting property is high by providing a piezoelectric element capable of obtaining the high displacement property.

According to still another aspect of the invention, there is provided a liquid ejecting apparatus having the above-described liquid ejecting head. Liquid can be ejected as desired by having the liquid ejecting head with the high liquid ejecting property.

BRIEF DESCRIPTION OF THE DRAWINGS

The invention will be described with reference to the accompanying drawings, wherein like numbers reference like elements.

DESCRIPTION OF EXEMPLARY EMBODIMENTS

Ink Jet Recording Head

First, an ink jet recording head will be described as an example of a liquid ejecting head according to the invention.

Figure 1:
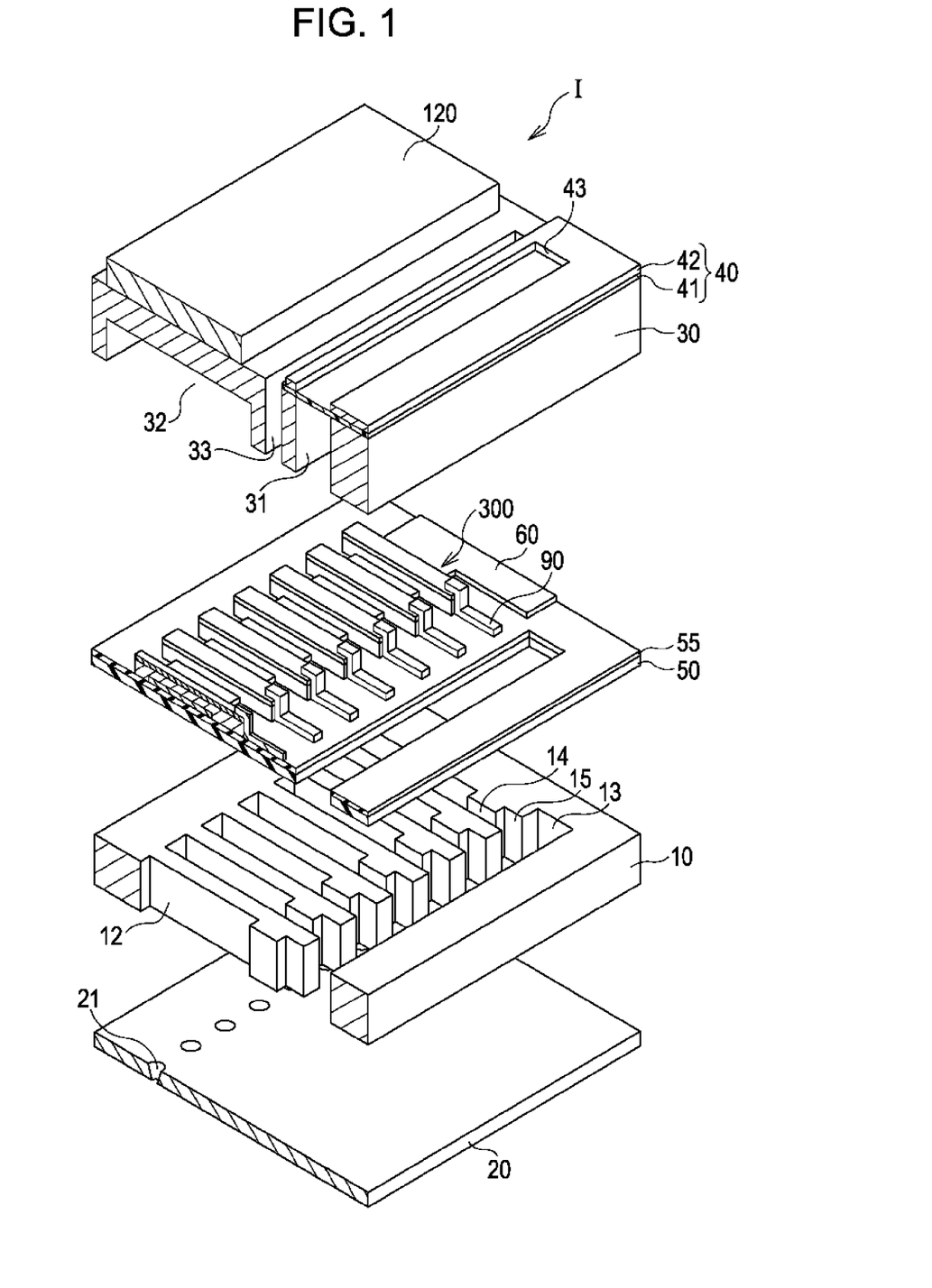
FIG. 1 is an exploded perspective view illustrating a liquid ejecting head according to Embodiment 1 of the invention.

FIG. 1 is an exploded perspective view schematically illustrating a configuration of an ink jet recording head according to Embodiment 1 of the invention.

Figure 2A:
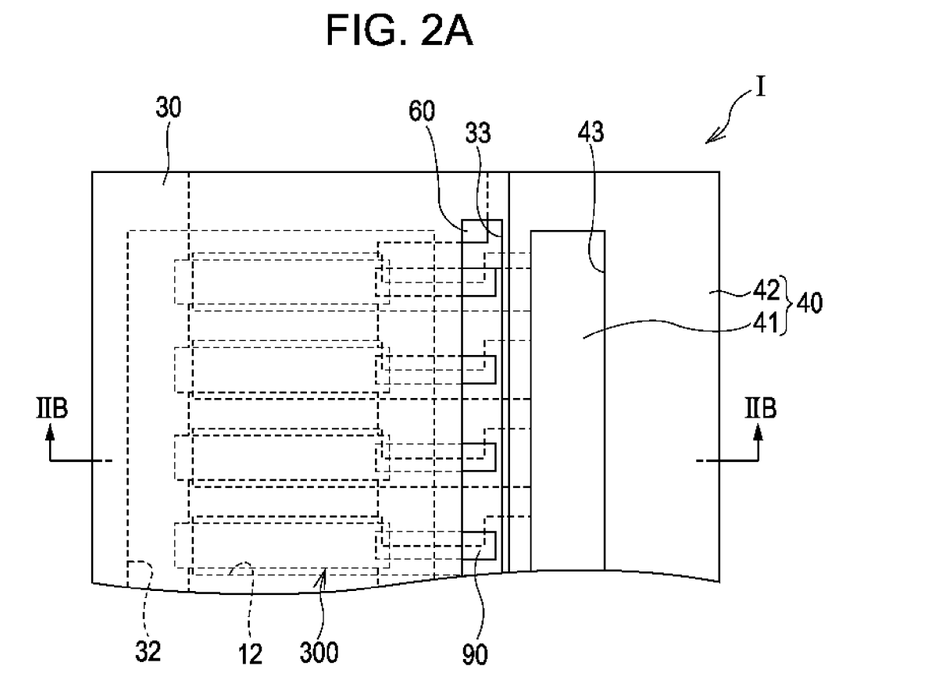
FIGS. 2A and 2B are plan and cross-sectional views illustrating the liquid ejecting head according to Embodiment 1 of the invention.
Figure 2B:
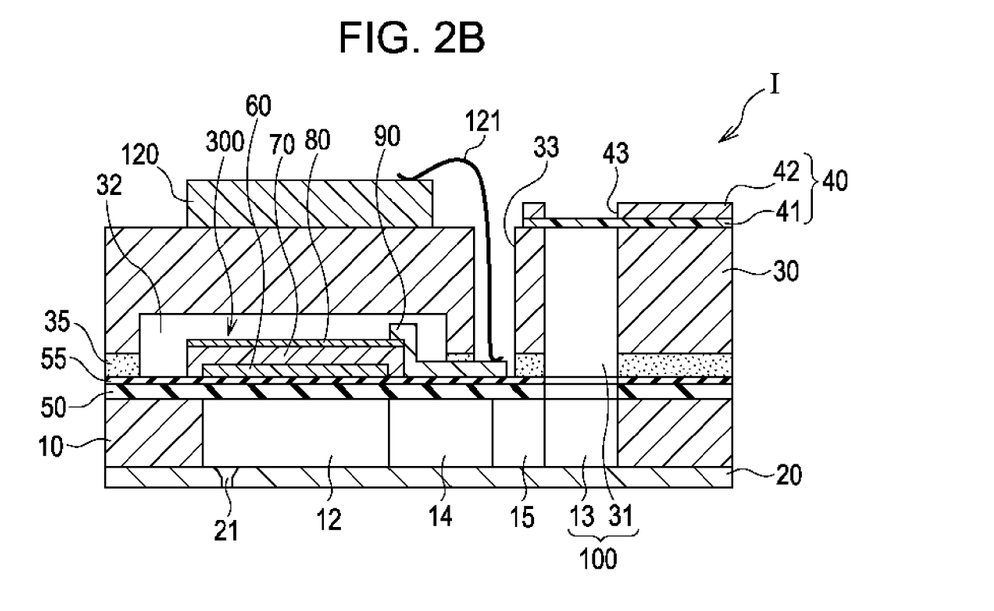

FIGS. 2A and 2B are a plan view of FIG. 1 and a cross-sectional view taken along the line IIB-IIB thereof.

As illustrated in the drawing, a flow path substrate 10 is a single-crystal silicon substrate and an elastic film 50 formed of silicon dioxide is formed on one surface thereof.

Plural pressure chambers 12 are arranged in parallel in the width direction thereof in the flow path substrate 10. A communication portion 13 is formed in an outside area of a direction orthogonal to the direction of arranging the pressure chambers 12 in the flow path substrate 10, and the communication portion 13 and each of the pressure chambers 12 communicate with each other through an ink supply path 14 and a communication path 15 provided for each of the pressure chambers 12. The communication portion 13 communicates with a manifold portion 31 of a protective substrate which will be described below to form a part of a manifold serving as a common ink chamber of the pressure chambers 12. The ink supply path 14 has a width narrower than that of the pressure chamber 12 and maintains the flow path resistance of ink flowing from the communication portion 13 to the pressure chamber 12 at a constant.

In addition, on an opening surface side of the flow path substrate 10, a nozzle plate 20, which has a nozzle opening 21 communicating with the vicinity of an end portion opposite to the ink supply path 14 of each of the pressure chambers 12, is fixed by an adhesive, a heat bonding film, and the like. In addition, the nozzle plate 20 is made of, for example, glass ceramics, single-crystal silicon substrate, stainless steel, or the like.

On the other hand, on a side opposite to the opening surface of the flow path substrate 10, the elastic film 50 is formed as described above. An insulating layer 55 formed of zirconium oxide is formed on the elastic film 50. In addition, an orientation control layer may be provided instead of the insulating layer 55 or may be provided on an upper surface of the insulating layer 55 such that a first electrode 60 is preferentially oriented in a (100) plane.

Furthermore, the first electrode 60, a piezoelectric layer 70, and a second electrode 80 are laminated on the insulating layer 55 in a manufacturing method which will be described below to form a piezoelectric element 300. Here, the piezoelectric element 300 includes the first electrode 60, the piezoelectric layer 70, and the second electrode 80. Generally, the piezoelectric element 300 is configured such that one of the electrodes is a common electrode and the other electrode and the piezoelectric layer 70 are patterned for each of the pressure chambers 12. In this embodiment, the first electrode 60 is the common electrode of the piezoelectric element 300 and the second electrode 80 is the individual electrode of the piezoelectric element 300. However, there is no problem even when the electrodes are switched according to circumstances of a drive circuit and wiring. In addition, here, the piezoelectric element 300 and a vibrating plate which generates displacement by the driving of the piezoelectric element 300 are collectively referred to as an actuator device. In the above-described example, the elastic film 50, the insulating layer 55, and the first electrode 60 act as the vibrating plate, but the invention is not limited thereto. For example, only the first electrode 60 may act as the vibrating plate without providing the elastic film 50 and the insulating layer 55. In addition, the piezoelectric element 300 may also be substantially used as the vibrating plate.

Here, the above-described first electrode 60 is formed of metal selected from a group consisting of platinum group metals such as iridium (Ir), platinum (Pt), and palladium (Pd); and Gold (Au), and may be formed by laminating plural layers. When the plural layers are laminated, a mixed layer may be formed as a result of subsequent processes. In this embodiment, the first electrode 60 is a laminated film of Pt, Ir, and Pt in order from the insulating layer 55.

The piezoelectric layer 70 is formed on the first electrode 60 and made of piezoelectric materials exhibiting an electromechanical transduction action. The piezoelectric layer 70 is formed by laminating piezoelectric films, which are crystal films having a perovskite structure, and includes at least Pb, Ti, and Zr. As the materials of the piezoelectric layer 70, piezoelectric materials (ferroelectric materials) such as lead zirconate titanate (PZT); and materials in which metal oxides such as niobium oxide, nickel oxide, or magnesium oxide is added to the piezoelectric materials are preferably used, for example. In addition, lead lanthanum zirconate titanate ((Pb, La)(Zr,Ti)$O_3$), lead zirconate titanate magnesium niobate (Pb(Zr,Ti)(Mg,Nb)$O_3$), or the like can also be used.

In this embodiment, lead zirconate titanate is used. In this embodiment, in lead zirconate titanate Pb($Zr_x Ti_{1-x} O_3$) included in the piezoelectric layer 70, the following expression is satisfied: $0.47 \le x \le 0.53$; preferably $0.48 \le x \le 0.52$; and ideally x=0.5. When x is in the above-described range, dielectric constant and piezoelectric property are improved significantly, thereby obtaining a desired displacement property. On the other hand, when x is more than the above-described range, durability and piezoelectric property deteriorate.

In the piezoelectric layer 70 epitaxially grown on the first electrode 60, the orientation thereof is controlled by the plane orientation of the first electrode 60 and the crystals are preferentially oriented in the (100) plane. Here, the preferential orientation represents a state where the crystal orientation direction is not random and a specific crystal plane is directed almost in the same direction. Specifically, "being preferentially oriented in the (100) plane" represents that a diffraction intensity ratio of a (100) plane, a (110) plane, and a (111) plane which are generated when the piezoelectric film is measured by wide-angle x-ray diffraction, that is, a value of (100)/((100)+(110)+(111)) is greater than 0.5.

When the piezoelectric layer 70 is measured by wide-angle X-ray diffraction, a diffraction peak position (2θ) of X-rays derived from the preferentially oriented (100) plane is from 21.89 to 21.97 and a half-peak width (2θ) of a (200) plane is from 0.30 to 0.50 (the wavelength λ of diffracted X-rays is 1.5405 angstrom). In the piezoelectric layer according to this embodiment, piezoelectric films other than a first-layer piezoelectric film prepared by contacting the top surface of the first electrode 60 are collectively formed by burning. In this embodiment, the piezoelectric films are adjusted in the degreasing process, the burning process, and the like and thus the piezoelectric layer can be obtained as a crystal system having the predetermined diffraction peak position above.

As described above, the diffraction peak position of X-rays derived from the (100) plane is on a relatively wide-angle side (side in which the numerical value is smaller). Accordingly, the piezoelectric layer 70 forms rhombohedral crystals, tension stress is reduced in the piezoelectric layer, and flexure when a voltage is not applied to the piezoelectric layer can be adjusted toward an opposite side of the pressure chamber 12. When a voltage is applied to the piezoelectric layer after bending it toward the opposite side to the pressure chamber 12 in this way, the piezoelectric layer is bent toward the pressure chamber 12 side. As a result, the displacement can be increased with a low voltage. In addition, the half-peak width of the (200) plane in the X-ray diffraction peak is low as described above. Accordingly, the composition change (composition gradient) in the thickness direction is small, the piezoelectric layer having a desired piezoelectric property can be formed, and thus the displacement can be increased.

Figure 3:
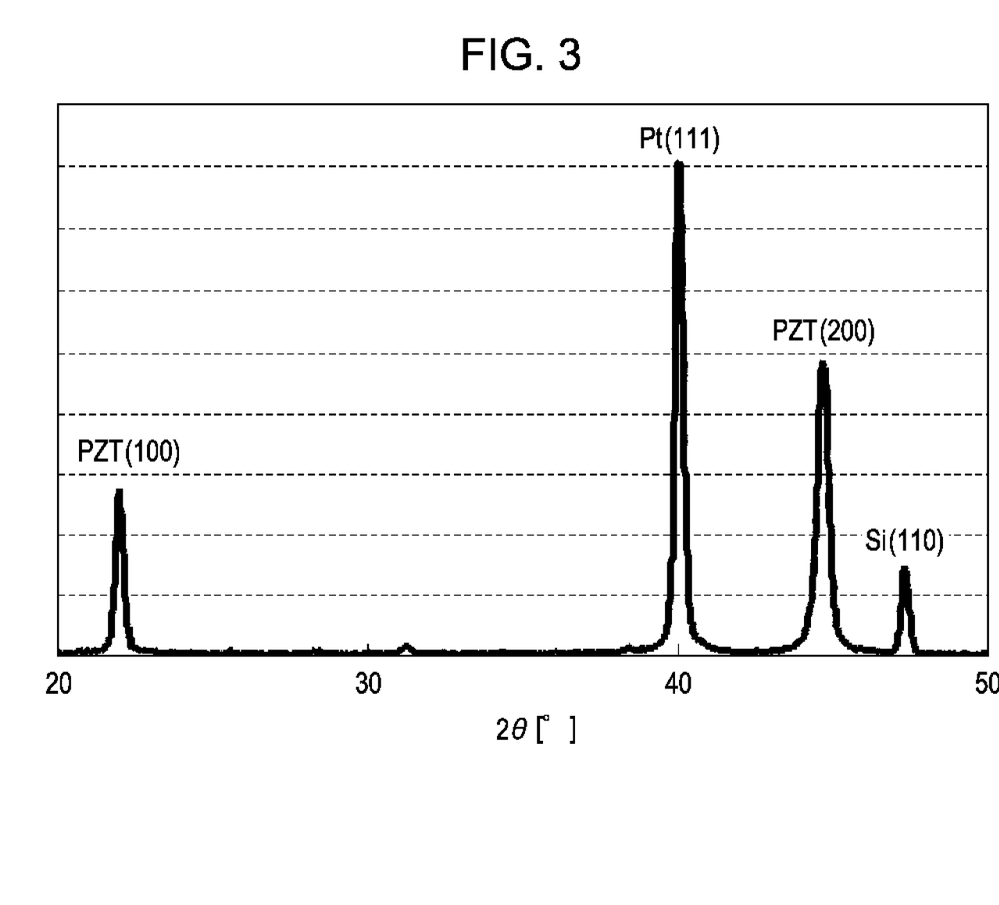
FIG. 3 is a diagram illustrating X-ray diffraction peak values of a piezoelectric layer.

For example, when the piezoelectric layer 70 is measured by wide-angle X-ray diffraction (the measurement device used is D8 DISCOVER with GADDS (trade name, manufactured by Bruker AXS); the wavelength λ of diffracted X-rays is 1.5405 angstrom), the diffraction peak is as illustrated in FIG. 3. That is, the diffraction peak position 2θ of X-rays derived from the (100) plane is 21.93 and the half-peak width of the (200) plane is 0.39.

The thickness of the piezoelectric layer 70 is suppressed to a degree that a crack is not caused in the manufacturing process and that a sufficient displacement property is exhibited. Specifically, the thickness of the piezoelectric layer 70 is generally from 0.2 μm to 5 μm, but 0.6 μm to 1.5 μm in the invention. In this embodiment, the thickness is 1330 nm. Such a piezoelectric layer 70 having the relatively thin thickness has a favorable durability and displacement.

In this embodiment, since the piezoelectric layer 70 is provided by epitaxial growth which will be described below, it is preferable that the film thereof be formed under predetermined conditions so as to have a crystal structure and lattice spacing similar to those of an underlayer. In addition, it is preferable that the film be formed so as to have a crystal structure in which there is no repulsion to electrostatic interaction with the surface of the underlayer. In addition, the piezoelectric layer 70 may be provided by free growth which is not restricted by the orientation of the underlayer.

In such a piezoelectric layer, when the diffraction peak position ($2\theta$) of X-rays derived from the (100) plane is from 21.89 to 21.97 and the half-peak width ($2\theta$) of the (200) plane is from 0.30 to 0.50, a desired high displacement property can be obtained.

A lead electrode 90 formed of, for example, Gold (Au), which is drawn out from the vicinity of an end portion on the ink supply path 14 side and extends up to the insulating layer 55, is connected to each of the second electrodes 80 which are individual electrodes of the piezoelectric element 300.

The protective substrate 30, which includes the manifold portion 31 forming at least a part of the manifold 100, is bonded by an adhesive 35 to the flow path substrate 10 where the piezoelectric element 300 is formed, that is, to the first electrode 60, the insulating layer 55, and the lead electrode 90. In this embodiment, the manifold portion 31 penetrates the protective substrate 30 in the thickness direction and is formed across the width direction of the pressure chamber 12, and communicates with the communication portion 13 of the flow path substrate 10 to form the manifold 100 as the common ink chamber of the pressure chambers 12 as described above.

In addition, a piezoelectric element holding portion 32, which has a space to a degree not interfering with the movement of the piezoelectric element 300, is provided in an area opposite to the piezoelectric element 300 of the protective substrate 30. The piezoelectric element holding portion 32 has only to have a space to a degree not interfering with the movement of the piezoelectric element 300. The space may be sealed or not be sealed.

As the materials of the protective substrate 30, materials having substantially the same coefficient of thermal expansion as that of the flow path substrate 10 is preferable, for example, glass or ceramic materials. In this embodiment, the protective substrate 30 is formed by using a single-crystal silicon substrate which is the same material as that of the flow path substrate 10.

In addition, the protective substrate 30 is provided with a through-hole 33 penetrating the protective substrate 30 in the thickness direction. In addition, the lead electrode 90 drawn out from each of the piezoelectric elements 300 is provided such that the vicinity of an end portion thereof is exposed to the through-hole 33.

In addition, a drive circuit 120 for driving the piezoelectric elements 300 arranged in parallel is fixed to the protective substrate 30. As the drive circuit 120, a circuit board, a semiconductor integrated circuit (IC), or the like can be used, for example. In addition, the drive circuit 120 and the lead electrode 90 are electrically connected to each other through a connection wiring 121 including a conductive wire such as a bonding wire.

In addition, a compliance substrate 40 including a sealing film 41 and a fixed plate 42 is bonded to the protective substrate 30. Here, the sealing film 41 is made of flexible materials having a low rigidity. One surface of the manifold portion 31 is sealed by this sealing film 41. In addition, the fixed plate 42 is made of relatively hard materials. Since an area, opposite to the manifold 100, of this fixed plate 42 is an opening 43 penetrating completely in the thickness direction, the surface of the manifold 100 is sealed only by the flexible sealing film 41.

In such an ink jet recording head according to this embodiment, ink is suctioned from an ink inlet connected to external ink supply means (not illustrated); the inner area from the manifold 100 to the nozzle opening 21 is filled with the ink; a voltage is applied between the first electrode 60 and the second electrodes 80 corresponding to the pressure chamber 12 according to a recording signal output from the drive circuit 120; and the elastic film 50, the insulating layer 55, the first electrode 60, and the piezoelectric layer 70 are bent. As a result, the pressure in the respective pressure chambers 12 is increased to discharge ink droplets through the nozzle opening 21. In this case, in this embodiment, the piezoelectric layer 70 is preferentially oriented in the (100) plane, the diffraction peak position ($2\theta$) of X-rays derived from the (100) plane is from 21.89 to 21.97, and the half-peak width ($2\theta$) of the (200) plane is from 0.30 to 0.50. As a result, the bending amount is large and a large displacement (for example, 470 nm according to the measurement result illustrated in FIG. 3) can be obtained with a low drive voltage.

Manufacturing Method

Hereinafter, a method of manufacturing the above-described ink jet recording head will be described with reference to FIGS. 4A to 9. Here, FIGS. 4A to 9 are cross-sectional views illustrating the method of manufacturing the ink jet recording head.

Figure 4A:
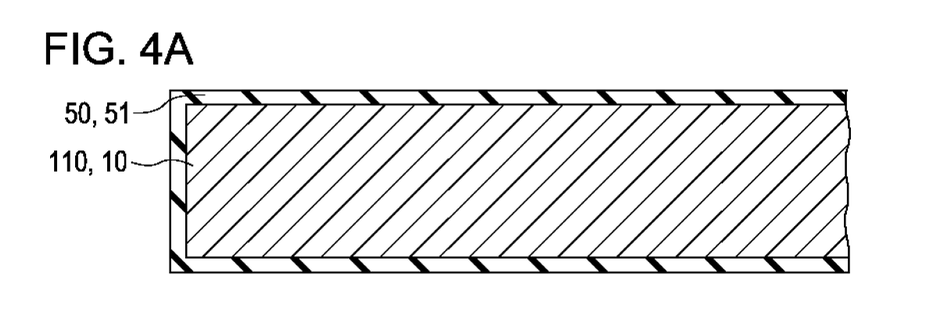
FIGS. 4A to 4D are cross-sectional views illustrating a method of manufacturing a recording head according to the invention.
Figure 4B:
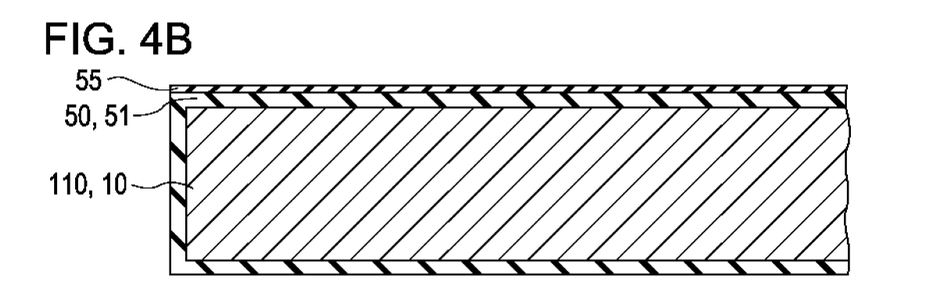

First, as illustrated in FIG. 4A, a silicon dioxide film 51 formed of silicon dioxide ($SiO_2$) which forms the elastic film 50 is formed on the surface of a flow path substrate wafer 110 as a silicon wafer in which the plural flow path substrates 10 are integrally formed. Next, as illustrated in FIG. 4B, a zirconium (Zr) layer is formed on the elastic film 50 (silicon dioxide film 51), followed by thermal oxidation in a diffusion furnace at, for example, 500° C. to 1200° C. to form the insulating layer 55 formed of zirconium oxide ($ZrO_2$).

Figure 4C:
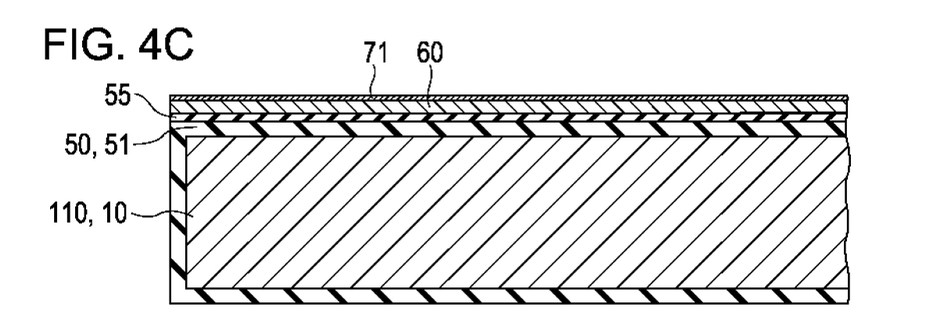

Next, as illustrated in FIG. 4C, the first electrode 60 is formed across the entire surface of the insulating layer 55. As the materials of the first electrode 60, when considering the fact that the piezoelectric layer 70 is formed of lead zirconate titanate (PZT), materials having a small change in conductivity caused by diffusion of lead oxide are preferable. To that end, as the materials of the first electrode 60, platinum, iridium, and the like are preferably used. In addition, the first electrode 60 can be formed by, for example, sputtering or PVD (physical vapor deposition).

Next, the piezoelectric layer formed of lead zirconate titanate (PZT) is formed on a surface where the first electrode 60 of the flow path substrate wafer 110 is formed. In this embodiment, the piezoelectric layer 70 is formed using a so-called sol-gel method in which a so-called sol (applying solution) obtained by dissolving and dispersing an organic metal compound in a solvent is applied and dried to turn it into a gel, followed by burning at a high temperature to obtain the piezoelectric layer 70 formed of metal oxide. The method of manufacturing the piezoelectric layer 70 is not limited to the sol-gel method. For example, MOD (Metal-Organic Decomposition) method may be used.

As a specific procedure of forming the piezoelectric layer 70, first, as illustrated in FIG. 4C, a first titanium-containing layer 71 which is formed of titanium (Ti) with a predetermined thickness is formed on the first electrode 60 by sputtering (for example, by DC sputtering in this embodiment). The sputtering conditions at this time are not particularly limited, but the sputtering pressure is preferably in the range from 0.4 Pa to 4.0 Pa. In addition, the sputtering output is preferably from 50 W to 100 W, and the sputtering temperature is preferably in the range from normal temperature (about 23° C. to 25° C.) to 200° C. Furthermore, the power density is preferably from 1 kW/m$^2$ to 4 kW/m$^2$. By forming the first titanium-containing layer 71 as described above, plural titanium seeds which will be formed in a subsequent process and be crystal nuclei of the piezoelectric layer 70 can be formed.

Figure 4D:
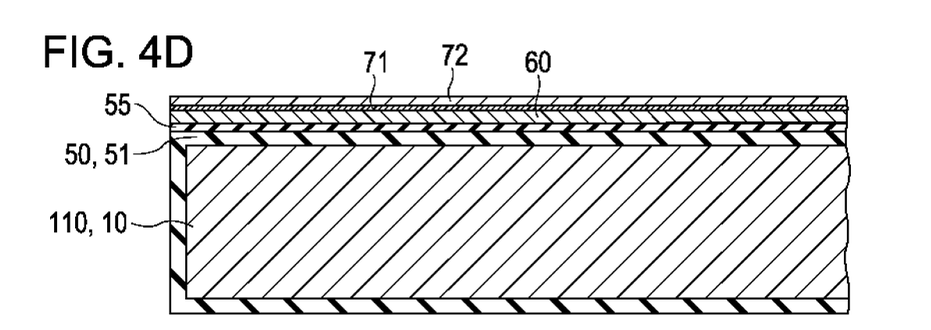

Thereafter, as illustrated in FIG. 4D, a piezoelectric precursor film 72 is formed, that is, the sol (solution) containing the organic metal compound is applied to the flow path substrate wafer 110 in which the first titanium-containing layer 71 is formed to form the piezoelectric precursor film 72 (applying process). Next, The piezoelectric precursor film 72 is heated at a predetermined temperature and dried for a given time (drying process). For example, in this embodiment, the piezoelectric precursor film 72 can be dried by being held at 100° C. to 180° C. for three to ten minutes and further held at 100° C. to 180° C. for three to ten minutes.

Next, the dried piezoelectric precursor film 72 is degreased by being heated at a predetermined temperature and held for a given time (degreasing process). In the degreasing process, the piezoelectric precursor film 72 is degreased by being heated at 300° C. to 400° C. and held for about three to ten minutes. In this embodiment, the piezoelectric precursor film is held at 375° C. for three minutes using a degreasing device which will be described below. The degreasing described herein represents that organic components, such as NO$_2$, CO$_2$, and H$_2$O, included in the piezoelectric precursor film 72 are made to be separated.

Figure 5:
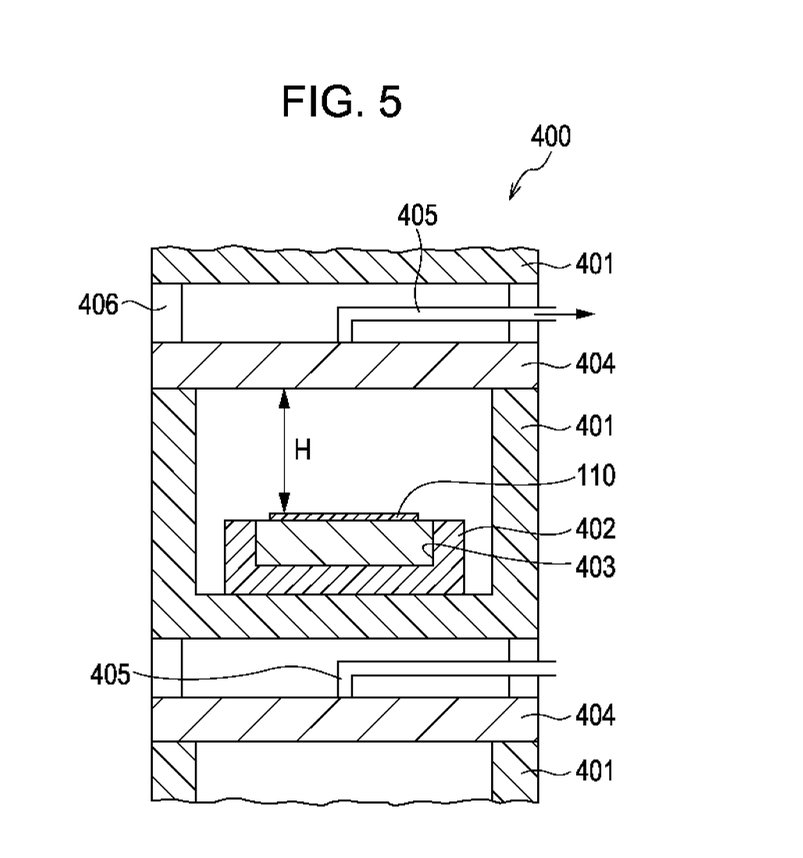
FIG. 5 is a diagram schematically illustrating a degreasing unit used for the method of manufacturing the recording head according to the invention.

As illustrated in FIG. 5, a degreasing device 400 is a so-called multistage degreasing device in which plural chambers 401 are loaded. The chamber 401 has a substrate placing plate 402 in which the flow path substrate wafer 110 having the piezoelectric precursor film 72 formed therein is placed. The substrate placing plate 402 is provided a heater 403 so as to heat the flow path substrate wafer 110. A ceiling of the chamber 401 is sealed by a lid portion 404. The lid portion 404 is provided with an exhaust pipe 405 for removing an internal gas in the center thereof. The exhaust pipe 405 extends between chamber supports 406 which are interposed between the chambers 401 loaded in the perpendicular direction to discharge an exhaust gas to the outside through a gap between the respective chambers 401.

In this embodiment, a distance H from a substrate surface of the flow path substrate wafer 110 to the lid portion 404 is from 10 cm to 20 cm. In a general degreasing device, a distance from the substrate surface to the lid portion 404 is about 2 cm, and, in this embodiment, the degreasing device 400 has the longer distance H as compared to this. As a result, the exhaust is efficiently performed in the degreasing process, and the piezoelectric film 73 thus obtained can obtain a large displacement with a low potential.

That is, when the distance H from the substrate surface to the lid portion 404 is 2 cm as in the general multistage degreasing device, the piezoelectric film is degreased from above as well as from below by a radiation heat of the lid portion 404. Originally, when the piezoelectric film is formed, it is desired to form crystal nuclei in a lower layer of the piezoelectric film. However, when the degreasing is also performed from above as described above, the crystal nuclei are formed randomly in the obtained piezoelectric film. Therefore, crystal growth from below is obstructed and the preferable piezoelectric film 73 with a uniform crystal orientation may not be formed.

In addition, when the distance from the substrate surface to the lid portion 404 is 2 cm as in the general degreasing device, a gas evaporated in the degreasing process, that is, the gas obtained by separating the organic components such as NO$_2$, CO$_2$, and H$_2$O included in the piezoelectric precursor film 72 is returned by the lid portion 404 to attach again to the piezoelectric precursor film of the flow path substrate wafer 110 in some cases, thereby not obtaining a sufficient degreasing effect.

On the other hand, in this embodiment, the distance H from the substrate surface of the flow path substrate wafer 110 to the lid portion 404 is from 10 cm to 20 cm, which is longer than 2 cm as the distance of the general degreasing device from the substrate surface to the lid portion 404. Accordingly, the piezoelectric precursor film is not easily affected by the effect of a heat generated from the chamber 401 which is placed thereabove. Furthermore, by making the distance H from the substrate surface of the flow path substrate wafer 110 to the lid portion 404 longer than that of the general degreasing device, the gas separated from the piezoelectric precursor film 72 in the degreasing process is easily led out through the exhaust pipe 405, thereby preventing the gas from being attached again to the piezoelectric precursor film.

Therefore, the piezoelectric precursor film 72 (refer to FIGS. 4A to 4D) in this embodiment can be degreased at a desired temperature in the degreasing process and is not easily affected by the effect of the heat generated from the upper chamber 401. Therefore, when the piezoelectric precursor film is heated in a subsequent process to be crystallized, the composition gradient is reduced and a desired piezoelectric film can be formed. Furthermore, the gas separated in the degreasing process is easily led out through the exhaust pipe 405, thereby suppressing the gas from being attached again. Accordingly, impurities are suppressed from being incorporated.

Figure 6A:
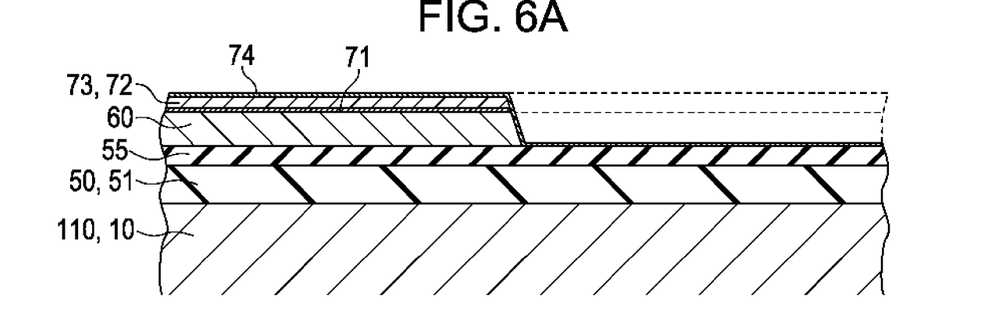
FIGS. 6A to 6C are cross-sectional views illustrating the method of manufacturing the recording head according to the invention.

Next, as illustrated in FIG. 6A, the piezoelectric precursor film is heated at a predetermined temperature by infrared heating equipment and held for a given time to be crystallized, thereby forming the piezoelectric film 73 (burning process). In this embodiment, the thickness of the first-layer piezoelectric film 73 is 120 nm. As will be described below, in this embodiment, the reason why the thickness of the first-layer piezoelectric film 73 is made thinner than those of the other piezoelectric films 73 is to control the orientation and crystal grain size of the piezoelectric layer 70.

In the burning process in which heating is performed using such infrared heating equipment, the piezoelectric precursor film 72 is preferably heated at 700° C. to 760° C. In this embodiment, the piezoelectric precursor film 72 is burned by the infrared heating equipment at 740° C. for five minutes to form the piezoelectric film 73. In addition, in the burning process, a preferable temperature rise rate is equal to or higher than 100° C./sec. By making the temperature rise rate equal to higher than 100° C./sec at the time of burning the piezoelectric film 73 in this way, heating time is shortened and the piezoelectric film 73 can be formed of crystals having a relatively small and uniform grain size, as compared to a case in which heating is performed at a low temperature rise rate for a long period of time, thereby substantially preventing crystals from being formed with a large grain size.

In the above-described drying process and degreasing process, by using the infrared heating equipment used in the burning process, the types of devices used are reduced and thus the manufacturing cost can be reduced. However, in the degreasing process, it is preferable to use the degreasing device because the epitaxial growth is performed from the first electrode 60 side of the piezoelectric precursor film 72 during degreasing as described above.

Then, as illustrated in FIG. 6A, in the step of forming the first-layer piezoelectric film 73 on the first electrode 60, the first electrode 60 and the first-layer piezoelectric film 73 are simultaneously patterned. The first electrode 60 and the first-layer piezoelectric film 73 can be patterned by, for example, dry etching such as ion milling.

Next, after the patterning, a second titanium-containing layer 74 is formed. The second titanium-containing layer 74 is formed across the first-layer piezoelectric film 73 and the insulating layer 55. The second titanium-containing layer 74 is formed to control the orientation of the piezoelectric film 73 formed on the second titanium-containing layer 74. Similar to the case of the first titanium-containing layer 71, the second titanium-containing layer 74 is formed with a predetermined thickness by, for example, sputtering.

Figure 6B:
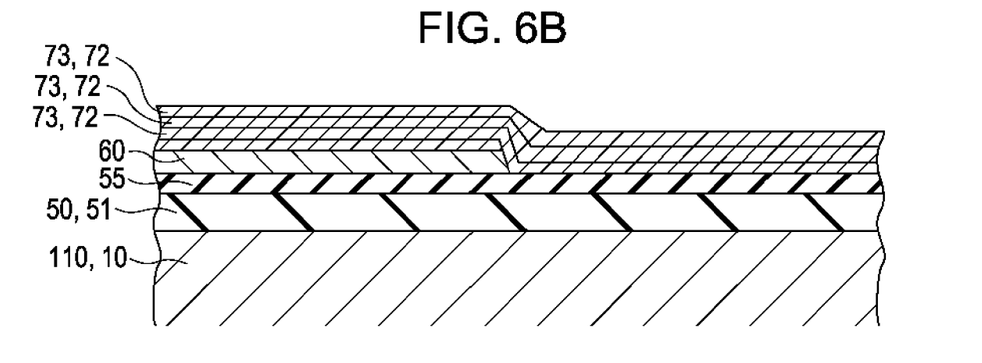

Thereafter, the precursor film forming process including the above-described applying process, drying process, and degreasing process is repeated to form plural layers (three layers in the drawing) of the piezoelectric precursor films 72 as illustrated in FIG. 6B. Then, the plural layers of the piezoelectric precursor films 72 are collectively subjected to the burning process to form the plural layers of the piezoelectric films 73 (batch burning process). In this embodiment, the thickness of the piezoelectric films 73 obtained by being collectively burned in the batch burning process is equal to or thicker than 140 nm and preferably equal to or thicker than 240 nm.

Figure 6C:
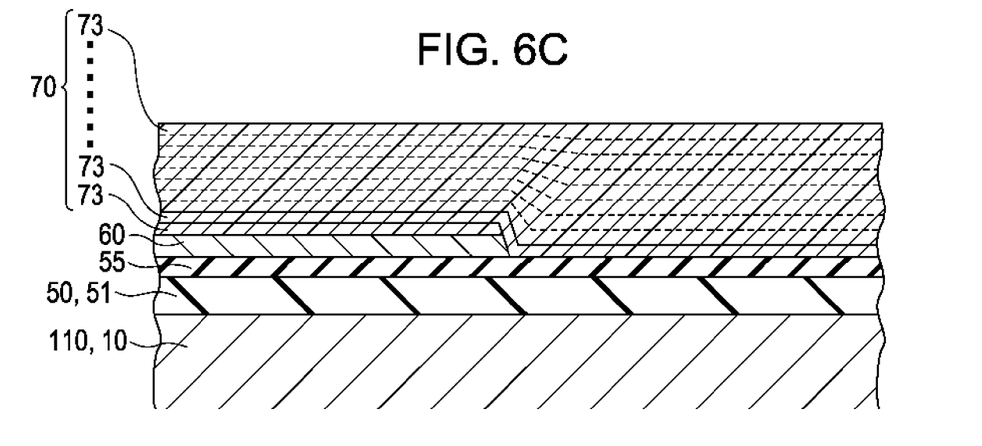

The batch burning process is repeated after repeating the precursor film forming process multiple times. As a result, the piezoelectric layer 70 with a predetermined thickness including the plural layers of the piezoelectric films 73 is formed as illustrated in FIG. 6C. For example, in this embodiment, the batch burning process is repeated three times after repeating the precursor film forming process three times. Then, the batch burning process is performed after forming two layers of the piezoelectric precursor films 72, followed by twelve times of application in total. As a result, the piezoelectric layer 70 with a thickness of about 1330 nm as a whole can be obtained.

Figure 7A:
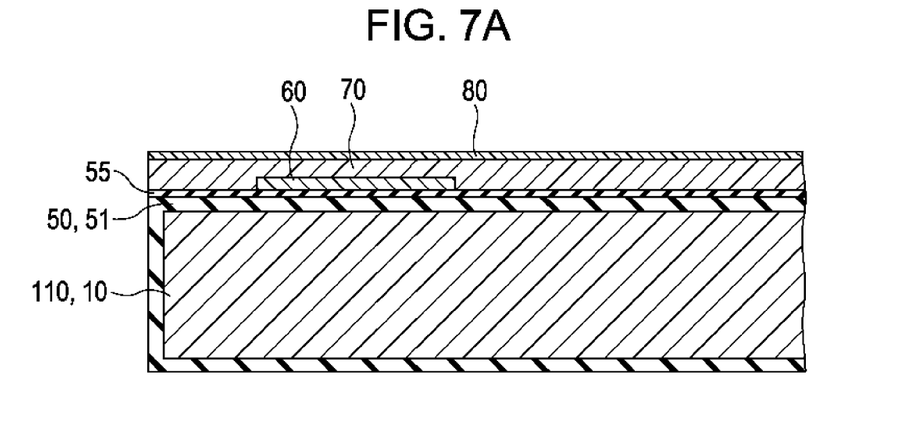
FIGS. 7A to 7C are cross-sectional views illustrating the method of manufacturing the recording head according to the invention.
Figure 7B:
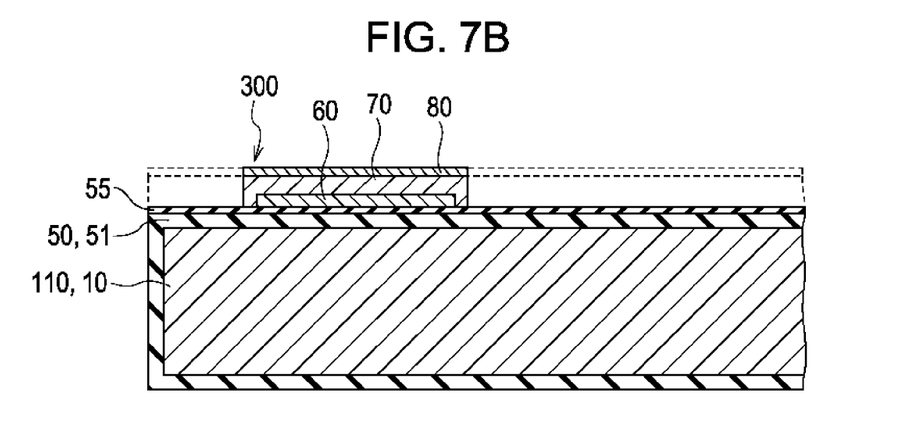

Thereafter, as illustrated in FIG. 7A, the second electrode 80 formed of, for example, iridium (Ir) is formed across the piezoelectric layer 70. In addition, as illustrated in FIG. 7B, the piezoelectric layer 70 and the second electrode 80 are patterned in an area opposite to each of the pressure chambers 12 to form the piezoelectric element 300. The piezoelectric layer 70 and the second electrode 80 are patterned by, for example, dry etching such as reactive ion etching or ion milling.

Figure 7C:
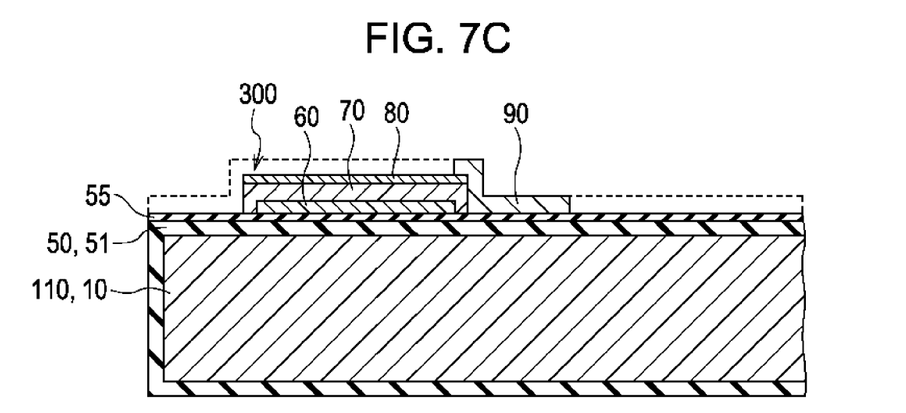

Next, the lead electrode 90 is formed. Specifically, as illustrated in FIG. 7C, the lead electrode 90 is formed across the entire surface of the flow path substrate wafer 110 and patterned for each of the piezoelectric elements 300 using, for example, a mask pattern (not illustrated) made of resist and the like.

Figure 8A:
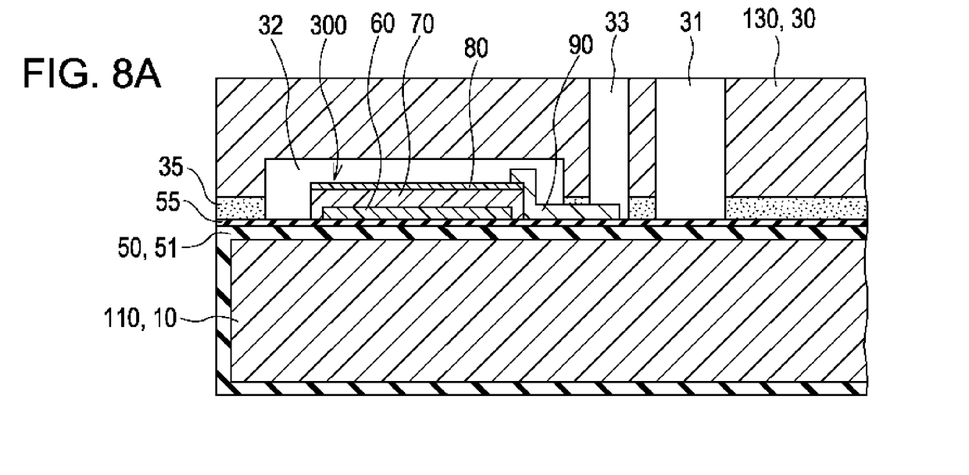
FIGS. 8A to 8C are cross-sectional views illustrating the method of manufacturing the recording head according to the invention.

Next, as illustrated in FIG. 8A, a protective substrate wafer 130 as a silicon wafer including the plural protective substrates 30 is bonded by the adhesive 35 to the piezoelectric element 300 side of the flow path substrate wafer 110.

Figure 8B:
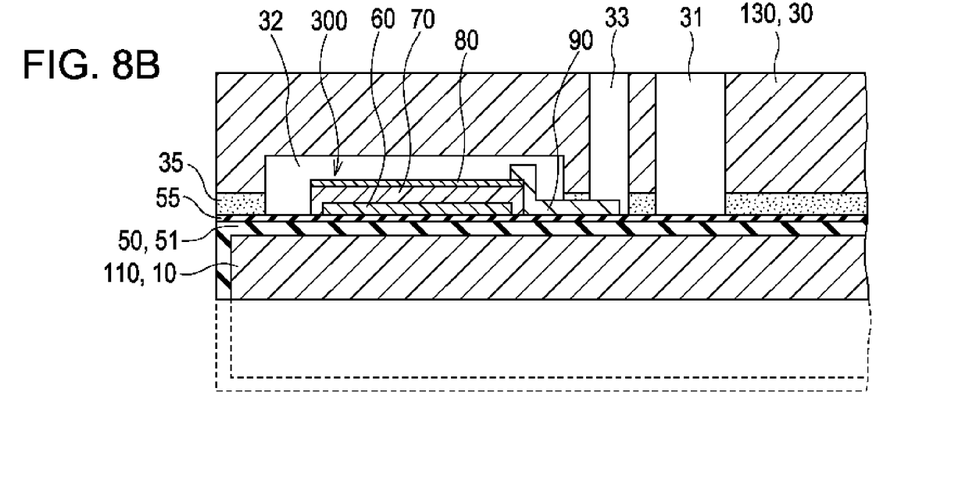
Figure 8C:
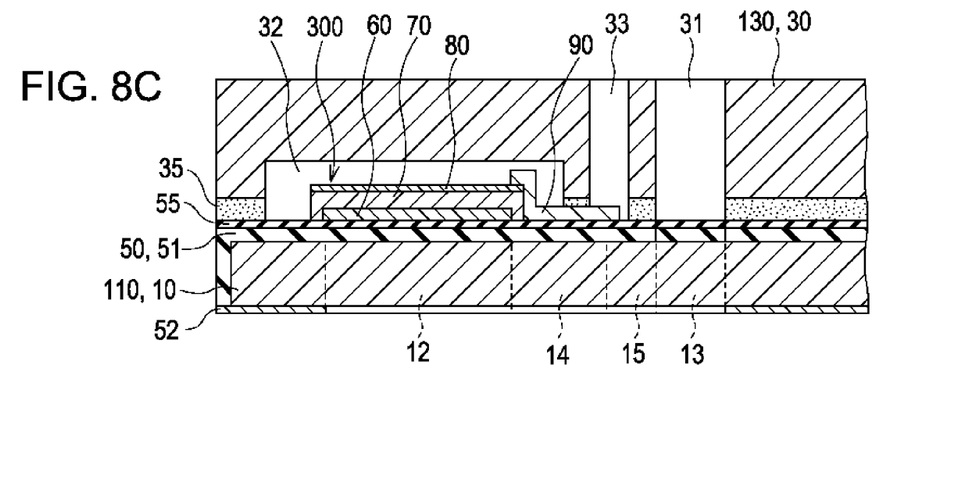
Figure 9:
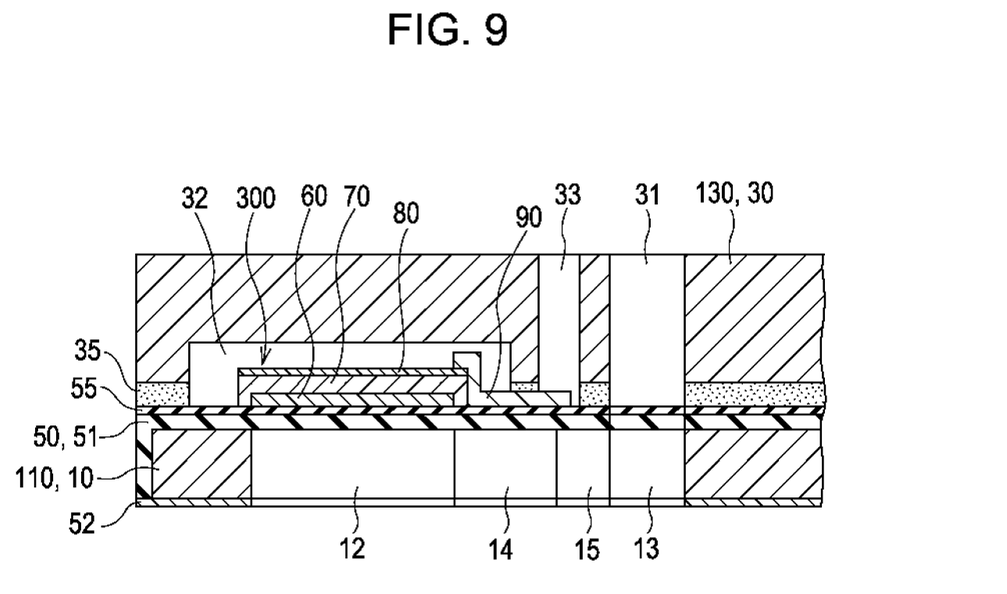
FIG. 9 is a cross-sectional view illustrating the method of manufacturing the recording head according to the invention.

Next, as illustrated in FIG. 8B, the flow path substrate wafer 110 is made thin to have a predetermined thickness. Next, as illustrated in FIG. 8C, a mask film 52 is newly formed on the flow path substrate wafer 110 to be patterned in a predetermined shape. Then, as illustrated in FIG. 9, the flow path substrate wafer 110 is subjected to anisotropic etching (wet etching) using an alkali solution such as KOH through the mask film 52. As a result, the pressure chamber 12, the communication portion 13, the ink supply path 14, the communication path 15, and the like corresponding to the piezoelectric element 300 are formed.

Then, unnecessary portions in the outer peripheral areas of the flow path substrate wafer 110 and the protective substrate wafer 130 are cut out by, for example, dicing. In addition, the nozzle plate 20 having the nozzle opening 21 is bonded to a side opposite to the protective substrate wafer 130 of the flow path substrate wafer 110, the compliance substrate 40 is bonded to the protective substrate wafer 130, and the flow path substrate wafer 110 and the like are divided by the single-chip sized flow path substrate 10 and the like to obtain an ink jet recording head I illustrated in FIG. 1.

Test Example

The piezoelectric element of such an ink jet recording head was formed in the method described in the above-described embodiment (Test example 1). In addition, in Test examples 2 to 5, the piezoelectric elements were respectively formed under different manufacturing conditions from those of Test example 1 to measure X-ray diffraction peaks and to calculate displacements.

The results are shown in Table below. In Table, the (100) peak position, the (200) half-peak width, and the displacement are included in the respective numerical ranges.

TABLE

|  | Manufacturing Conditions | (100) Peak Position | (200) Half-Peak Width | Displacement |
|---|---|---|---|---|
| Test Example 1 | Distance From Substrate to Lid Portion 2 cm | 21.89 to 21.97 | 0.51 to 0.65 | 400 to 450 |
| Test Example 2 | Distance From Substrate to Lid Portion 10 cm | 21.89 to 21.97 | 0.41 to 0.5 | 450 to 500 |
| Test Example 3 | Distance From Substrate to Lid Portion 20 cm | 21.89 to 21.97 | 0.3 to 0.4 | 500 to 550 |
| Test Example 4 | Distance From Substrate to Lid Portion 2 cm Excessive Lead | 21.80 to 21.88 | 0.51 to 0.65 | 400 to 450 |
| Test Example 5 | Distance From Substrate to Lid Portion 2 cm Too Little Titanium | 21.80 to 21.88 | 0.51 to 0.65 | 400 to 450 |

In Test examples 2 and 3, by performing the degreasing process using the above-described degreasing device in which the distance from the substrate to the lid portion is large, the piezoelectric element was able to be formed in which the diffraction peak position 2θ of X-rays derived from the (100) plane of the above-described piezoelectric layer is in the range from 21.89 to 21.97 and the half-peak width of the (200) plane is from 0.30 to 0.50. In particular, in the case of Test example 3, the displacement of the piezoelectric element is higher than those of the other test examples and thus a large displacement was able to be obtained. On the other hand, in Test examples 1, 4, and 5 in which the distance between the substrate to the lid portion is short, the respective displacements were small.

Other Embodiment

Hereinabove, the embodiment of the invention has been described, but the configuration of the invention is not limited thereto.

Figure 10:
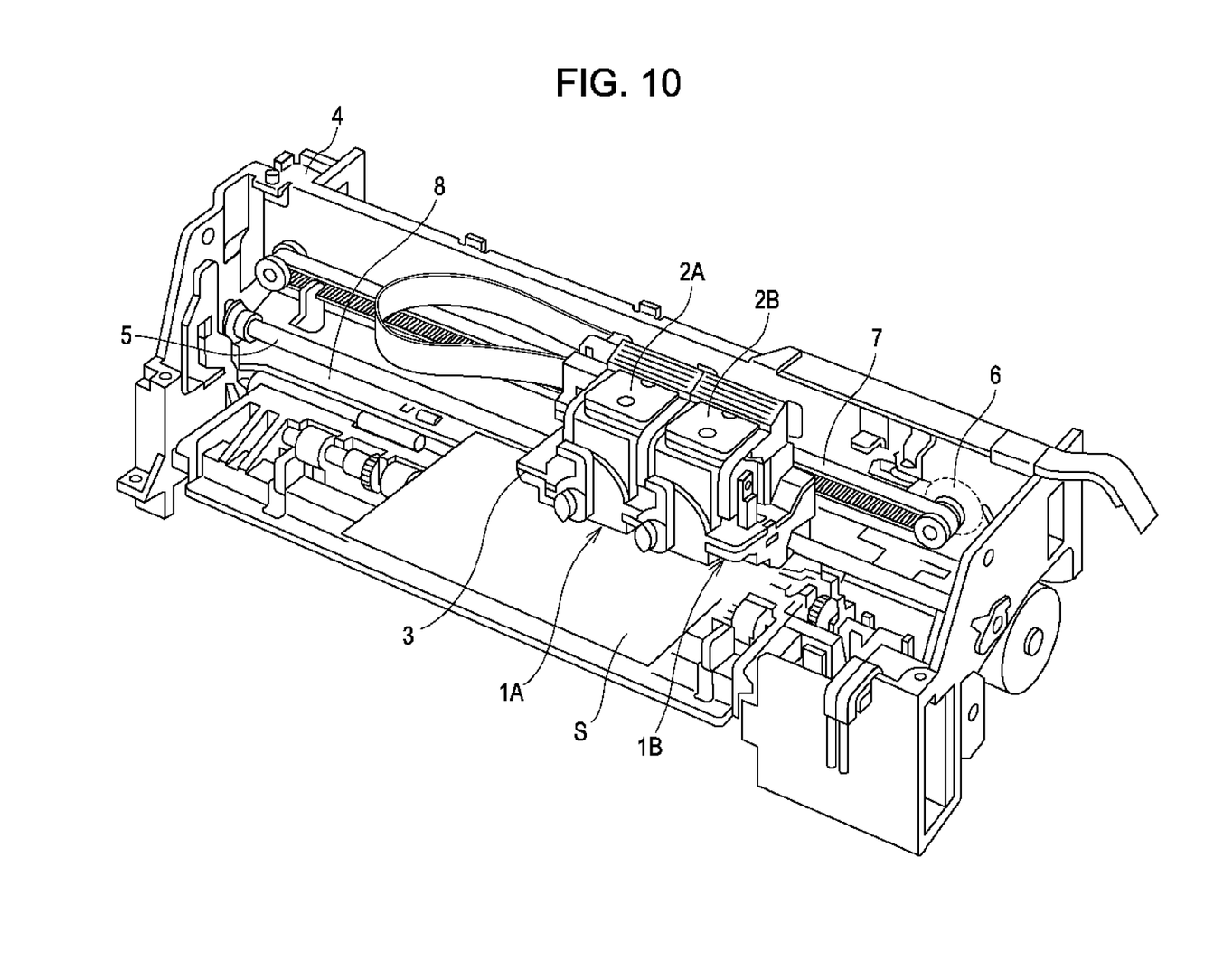
FIG. 10 is a perspective view illustrating a liquid ejecting apparatus according to the invention.

In addition, such a liquid ejecting head according to the invention forms a part of a recording head unit which is provided with the ink supply path communicating with an ink cartridge and the like, and is mounted on a liquid ejecting apparatus. FIG. 10 is a diagram schematically illustrating an example of the liquid ejecting apparatus.

As illustrated in FIG. 10, recording head units 1A and 1B having the liquid ejecting head are provided with detachable cartridges 2A and 2B configuring ink supply means. A carriage 3 on which the recording head units 1A and 1B are mounted is provided in a carriage axis 5 attached to an apparatus main body 4 so as to freely move in the axial direction. For example, the recording head units 1A and 1B discharge a black ink composition and a color ink composition, respectively.

The drive force of a drive motor 6 is transmitted to the carriage 3 through plural gears and a timing belt 7 which are not illustrated and thereby the carriage 3 on which the recording head units 1A and 1B are mounted moves along the carriage axis 5. On the other hand, a platen 8 is provided along the carriage axis 5 in the apparatus main body 4 and a recording sheet S as a recording medium such as paper which is fed by a sheet feeding roller and the like (not shown) is transmitted onto the platen 8.

In the above-described embodiment, the ink jet recording head has been described as an example of the liquid ejecting head according to the invention. However, the basic configuration of the liquid ejecting head is not limited thereto. The invention widely targets general liquid ejecting heads, and can be applied to, for example, various recording heads used for image recording apparatus such as printers; color material ejecting heads used for manufacturing color filters of liquid crystal displays and the like; electrode material ejecting heads used for forming electrodes of organic EL displays, FEDs (Field Emission Display), and the like; and bio-organic matter ejecting heads used for manufacturing a biochip.

Of course, the liquid ejecting apparatus on which such a liquid ejecting head is mounted is also not particularly limited.

Furthermore, the invention can be applied to a piezoelectric element configuring an actuator device which is mounted on various devices in addition to a piezoelectric element configuring an actuator device which is mounted on the liquid ejecting head as pressure generating means. For example, the invention can also be applied to a sensor or the like in addition to the above-described heads.

What is claimed is:

1. A piezoelectric element comprising:
   a piezoelectric film which comprises perovskite type crystals at least including Pb, Ti, and Zr; and
   an electrode which is provided to the piezoelectric film,
   wherein a diffraction peak position (2θ) of X-rays derived from a (100) plane of the piezoelectric film is from 21.89 to 21.97, and
   a half-peak width (2θ) of a (200) plane is from 0.30 to 0.50.

2. A liquid ejecting head comprising the piezoelectric element according to claim 1.

3. A liquid ejecting apparatus comprising the liquid ejecting head according to claim 2.

* * * * *